VOLTAGE CONTROLLED FIELD-EFFECT TRANSISTOR L-C OSCILLATOR

INVENTOR.
JOSEPH J. BOYAJIAN
BY ROY MILLER
ATTORNEY.
GERALD F. BAKER
AGENT.

FREQUENCY VERSUS VOLTAGE RESPONSE

INVENTOR.
JOSEPH J. BOYAJIAN
BY ROY MILLER
ATTORNEY.
GERALD F. BAKER
AGENT.

United States Patent Office 3,421,111
Patented Jan. 7, 1969

3,421,111
VOLTAGE CONTROLLED FIELD-EFFECT TRANSISTOR L-C OSCILLATOR

Joseph Jacob Boyajian, China Lake, Calif., assignor to the United States of America as represented by the Secretary of the Navy Filed Aug. 29, 1967, Ser. No. 664,219
U.S. Cl. 331—117 1 Claim
Int. Cl. H03b 5/00

ABSTRACT OF THE DISCLOSURE

The linear range of a voltage controlled oscillator is extended through the use of two or more voltage controlled elements in the VCO circuitry. In an exemplary oscillator circuit a field-effect transistor serves the dual functions of active element and voltage controlled element, and a varactor diode serves as a second voltage controlled element.

The invention described herein may be manufactured and used by or for the Government of the United States of America for governmental purposes without the payment of any royalties thereon or therefor.

*Background of the invention*

The present invention relates to oscillators and more particularly to voltage controlled oscillators and specifically to a voltage controlled oscillator having a wide tuning range, high stability, and a linear tuning response.

Prior art oscillators whose frequency may be varied electronically have been used for frequency modulators, automatic frequency controlled loops, and sweep frequency generators, for example. The electronically variable oscillators in use are generally the reactance tube controlled oscillator, the RC oscillator, and the multivibrator. Prior to this invention it has been observed that the available voltage controlled oscillators at best had a maximum linear operating range of only about 10% (i.e., 10% of the VCO center frequency).

According to the present invention, means is provided whereby the linear range (i.e., frequency change as a function of voltage change) of a voltage controlled oscillator (VCO) may be extended. As will be demonstrated, the linear range of a VCO can be extended by using two or more voltage controlled circuit elements in a manner such that they reduce each other's non-linearities. A voltage controlled oscillator built according to the invention has been shown to achieve a 30% linear range (i.e., 30% of center frequency). Any voltage controlled circuit element may be used.

*Detailed description of the invention*

Figure 1:
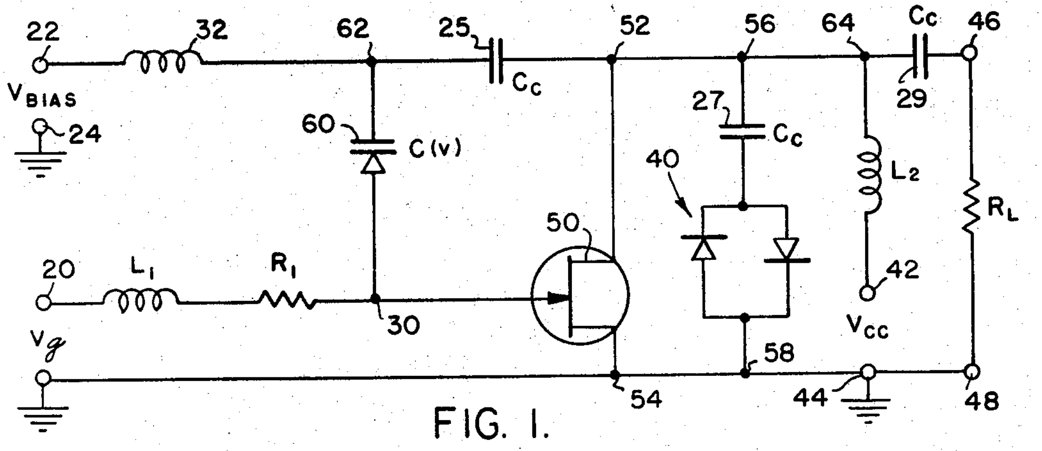
FIG. 1 shows a schematic of a linear voltage controlled oscillator according to the invention.

Illustrated in FIG. 1 is an oscillator which represents a practical and preferred embodiment of the invention. A controlled voltage is applied to the oscillator at terminal 20. In series connection between terminal 20 and junction 30 are the fixed inductance $L_1$ and a fixed resistance $R_1$. From junction 30 the voltage potential is applied to the gate of field effect transistor 50 and to a variable capacitance device or varactor 60. The element 60 may be any device which exhibits usable variations in capacity at a first impedance level in response to variations in current or voltage of a first range of magnitude and exhibits a substantial change in impedance level for a predetermined voltage or current outside of said range. The device may be, for example, a voltage responsive variable capacity diode which is responsive to variations in reverse bias to exhibit variations in capacitance at a high impedance level and responsive to a forward bias to exhibit a very low impedance. Bias for varactor 60 is supplied through terminals 22, 24 with a choke coil 32 located between terminal 22 and the varactor 60. The second voltage variable element in this circuit is the field effect transistor 50. The field effect transistor is a three-termial semiconductor device with high input and output impedances (measured in the megohms), and a transconductance $g_m$, which is typically of the order of 1,000 μmhos. The $g_m$ is a fuction of the voltage of the controlled element (which is denoted the gate), and may be varied over a wide range, (such as 10 to 1).

The power supply for the oscillator is located at $V_{CC}$ connected across terminals 42, 44. An inductance $L_2$ is inserted between terminal 42 and junction 64. Regulation of the VCO's output is obtained by a diode network 40. Coupling capacitors 25, 27 and 29 are inserted in order to separate A-C and D-C current components in the circuits. The resistance $R_L$ represents the load and is connected across output terminals 46, 48.

To better understand why the oscillator according to the invention operates as it does, we will first consider the circuit element constraints necessary for oscillation and secondly consider the mathematical analysis of a VCO built to the constraints and having two voltage variable elements which are controlled by a single voltage source as illustrated in FIG. 1.

The oscillator of FIG. 1 is of the class wherein a parallel resonant circuit is shunted by a negative resistance that has an absolute magnitude less than the parallel resonant impedance of the circuit.

Figure 2:
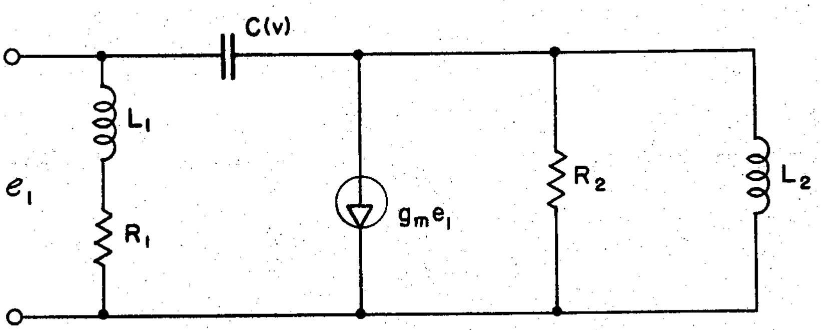
FIG. 2 is a low frequency equivalent circuit of the VCO of FIG. 1.

FIG. 2 shows a current source $g_m e_1$ which is representative of FET 50 shown in FIG. 1. The current source is placed in parallel with the series combination of $L_1$, $R_1$ and C(V). The current source will vary in accordance with the voltage appearing across $R_1$ and $L_1$.

FET 50 is chosen so that its $g_m$, which is voltage controlled, will exhibit a negative resistance characteristic in combination with $L_1$ and $R_1$. The amount of negative resistance is responsive to gating voltage $V_g$.

Figure 3:
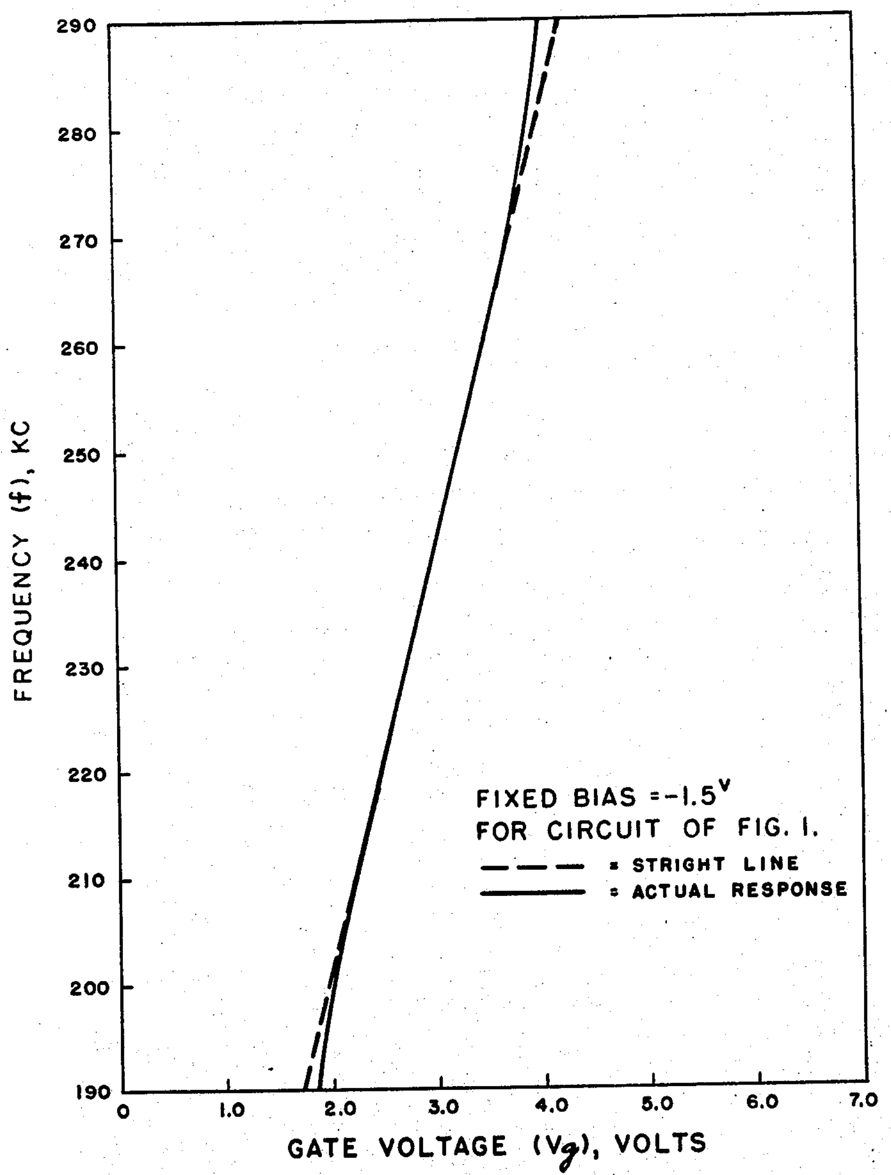
FIG. 3 shows a linearity chart of the oscillator of FIG. 1.

Thus a parallel resonant circuit is created by the parallel combination of $R_2$, $L_2$ and C(V) shunted by some negative resistance created by the combination of FET 50, $L_1$ and $R_1$. As gating voltage $V_g$ is applied to FET 50, oscillations will start up. As gating voltage $V_g$ is increased, the frequency of oscillation will increase as shown in FIG. 3.

*Circuit constraints*

Let us first assume that the low frequency equivalent of the oscillator of FIG. 1 is as it appears in FIG. 2. In FIG. 2, $R_2$ is the equivalent resistance of the parallel combination of the diodes in diode network 40 and the resistance $R_L$. The matrix description of FIG. 2 is:*

$$[Y][E]=[I] \tag{1}$$

For an oscillator, Equation 1 becomes $$[Y][E]=0 \tag{2}$$

and $$\det.\ [Y]=\begin{bmatrix} \left(\frac{1}{Z_1}+\frac{1}{Z_2}\right) & \left(-\frac{1}{Z_2}\right) \\ \left(-\frac{1}{Z_2}+g_m\right) & \left(\frac{1}{Z_2}+\frac{1}{Z_3}\right) \end{bmatrix}=0$$

*E. S. Kuh and D. O. Pederson, "Principles of Circuit Synthesis," McGraw-Hill Book Co., Inc., 1959, p. 52.

where $$Z_1=R_1+SL_1,\ Z_2=\frac{1}{SC(v)},\ Z_3=\frac{SL_2R_2}{SL_2+R_2}$$

$g_m$=transconductance of FET 50.

and $$[E]\neq 0$$

Performing the necessary operations we now find the constraints on circuit element values such that Equation 3 is satisfied.

$$L_1=10L_2 \quad (4)$$

$$R_2=10R_1 \quad (5)$$

$$g_mR_2=10 \text{ min.} \quad (6)$$

$$C(v) \text{ max.}=L_2R_1^2 \quad (7)$$

$$f=\frac{1}{2\pi}\left(\frac{1}{L_2R_2C(v)g_m}\right)^{1/2} \quad (8)$$

Thus, given any two elements (e.g., $f$ and $g_m$) the values for other circuit elements are determined.

*Linearization of the VCO frequency versus voltage response*

In this section it will be demonstrated mathematically and verified experimentally that if a VCO has two or more voltage variable elements then it is capable of having a wide range of linear operation.

Let $$C(v)=C \text{ min.}\left(\frac{V_B+\Phi}{V+\Phi}\right)^{1/2} \quad (9)$$

where $C_{min}$=capacity of varactor 60 when $V=V_B$
$V_B$=breakdown voltage of varactor 60
$\Phi$=contact potential of varactor 60
V=reverse bias applied across varactor 60 and $$g_m=g_{m_0}\left(\frac{W_0-V_g}{W_0}\right)^{1/2} \quad (10)$$

where $g_{m_0}$=transconductance of FET 50 when $V_g=0$
$V_g$=gate voltage of FET 50
$W_o$=pinch off voltage of FET 50.

Substituting Equations 9 and 10 into Equation 8, we have $$f=K\frac{(V+\Phi)^{1/4}}{\left(1-\frac{V_g}{W_0}\right)^{1/4}} \quad (11)$$

where $$K=\frac{1}{2\pi}\left(\frac{1}{L_2R_2g_{m_0}C_{min.}(V_B+\Phi^{1/2}}\right)^{1/2}$$

Since $f$ is to be a function of one variable $V_g$, let $V=\pm V_{bias}-V_g$, where $V_{bias}$ is constant but can be plus or minus.

Then Equation 11 becomes $$f=K_1\frac{(1\pm A_2V_g)^{1/4}}{(1-A_1V_g)^{1/4}} \quad (12)$$

where $$A_1=\frac{1}{W_0},\ A_2=\frac{1}{\pm V_{bias}+\Phi} \text{ and } K_1=\frac{K}{A_2}$$

Applying the binomial theorem to Equation 12, we have $$f/K_1=1+\frac{(A_1\pm A_2)}{4}V_g+\frac{(5A_1^2-3A_2^2\pm A_1A_2)}{16}V_g^2 + \frac{(15A_1^3\pm 7A_2^3-3A_1A_2^2\pm 5A_2A_1^2)}{128}V_g^3+\dots \quad (13)$$

for all $A_1$, $A_2$ such that $1>(A_1V_g)_2$ and $1>(A_2V_g)^2$

Equation 8 is approximated by $$f=K_2[1+(A_1\pm A_2)V_g] \quad (14)$$

where $$V_g\leq V_b$$

$$K_2=K_1/4$$

Examining Equation 14, we can point out several interesting facts.

(1) The frequency, $f$, can increase or decrease as $V_g$ increases depending on polarity of $V_{bias}$ (i.e., if the capacitance increases or decreases with $V_g$).

(2) If we can make the coefficients of $V_g^n$ (for all $n>1$) equal to zero then $f$ will be a linear funtion of $V_g$.

(3) The VCO will have a greater range of linear response for positive rather than negative values of $A_2$ (i.e., $(A_1+A_2)^2>(A_1-A_2)^2$).

(4) If Equation 13 has a number of different $A_n$ ($n=1, 2, 3 \ldots$) then there exists the possibility of making the coefficients of each $Vg^n$ (for $n=2, 3, 4 \ldots$) equal to zero. That is to say, the greater the number of voltage variable elements we can have, then the closer Equation 13 will approach Equation 14.

*Experimental results*

Using in the circuit of FIG. 1 a 2N3823 field effect transistor (FET) and a TRW PC 134 Varicap brand voltage variable capacitor, we find the values of the rest of the circuit elements from Equations 4 to 8 to be $$R_1=2\text{K},\ R_2=20\text{K},\ L_2=400\ \mu\text{h.},\ L_1=4 \text{ mh.}$$

$$C=(20\mu\mu f.)\frac{(5.05)}{(V+0.7)^{1/2}},\ g_m=(3600\times 10^{-6})\left(1-\frac{V_g}{4.8}\right)^{1/2}$$

and $$V_{bias}=1.5 \text{ v.}$$

For $V_g=-3$ v. the frequency should be 140 kc., however, the measured frequency was 240 kc. as shown in FIG. 3. The large error was caused by using $$R_L=R_2=20\text{K}$$

which is not true. The approximate value of $R_2$, with $R_L$=20K, is 5K. Using $R_2$=5K the frequency from Equation 8 is 280 kc.

The performance of this VCO is illustrated by FIG. 3 and it is seen that the response is fairly linear over a 30% range.

*Conclusions*

Equation 13 shows that by using two or more voltage variable elements in a VCO, its linear range of operation can be increased.

In practice, it is easier to empirically derive the required bias voltage than it is to solve Equation 13 due to difficulty in arriving at exact equations for $g_m(v)$ and $C(v)$.

Obviously may modifications and variations of the present invention are possible in the light of the above teachings. It is, therefore, to be understood that within the scope of the appended claim the invention may be practiced otherwise than as specifically described.

What is claimed is:

1. An oscillator circuit comprising:

a field effect transistor having source, drain and gate electrodes;

means for grounding said drain electrode;

means for placing said source electrode at a first higher potential than ground to bias said field effect transistor;

means for connecting a load resistance from the source electrode to the drain electrode of said field effect transistor;

means for coupling a first inductance across said load resistance;

means for placing in parallel with said load resistance the series combination of:

a coupling capacitance; and a back-to-back diode network;

means for connecting a voltage variable capacitor, a varactor, from the gate electrode to the source electrode of said field effect transistor;

means for establishing a gating potential;

means for connecting the series combination of a gating resistance and inductance from said gating potential to the gating electrode of said field effect transistor to induce oscillation in the voltage appearing across said load resistance; and means for varying the gating potential which in turn changes the potential applied across said voltage variable capacitor for changing the frequency of oscillation of the voltage which appears across said load resistance.

References Cited

UNITED STATES PATENTS 3,281,699 10/1966 Harwood ---------- 331—117 X

OTHER REFERENCES

Crystalonics, Inc., "Detuning and Temperature Compensation of the Varactron Diode," application notes, ANV–11, September 1965, pp. 1–2. 331–36C.

ROY LAKE, *Primary Examiner.*

SIEGFRIED H. GRIMM, *Assistant Examiner.*

U.S. Cl. X.R.

331—109, 177, 183

UNITED STATES PATENT OFFICE
CERTIFICATE OF CORRECTION

Patent No. 3,421,111 January 7, 1969

Joseph Jacob Boyajian

It is certified that error appears in the above identified patent and that said Letters Patent are hereby corrected as shown below:

Column 3, lines 55 and 56, the formula should appear as shown below:

$$K=\frac{1}{2\pi}\left(\frac{1}{L_2 R_2 g_{m_o} C_{min.}(V_B+\Phi)^{1/2}}\right)^{1/2}$$

Signed and sealed this 31st day of March 1970.

(SEAL)
Attest:

EDWARD M. FLETCHER, JR.
Attesting Officer

WILLIAM E. SCHUYLER, JR.
Commissioner of Patents